(12) United States Patent  
Drake et al.

(10) Patent No.: US 7,994,795 B2
(45) Date of Patent: Aug. 9, 2011

(54) SHORE POWER CORD GROUND WIRE CURRENT DETECTOR

(75) Inventors: William R. Drake, Fairfield, CA (US); John A. Kujawa, DelRay Beach, FL (US)

(73) Assignee: Actuant Corporation, Butler, WI (US)

( * ) Notice: Subject to any disclaimer, the term of this patent is extended or adjusted under 35 U.S.C. 154(b) by 275 days.

(21) Appl. No.: 12/340,305

(22) Filed: Dec. 19, 2008

(65) Prior Publication Data

US 2009/0160427 A1    Jun. 25, 2009

Related U.S. Application Data

(60) Provisional application No. 60/016,249, filed on Dec. 21, 2007.

(51) Int. Cl.
*G01R 31/02* (2006.01)
(52) U.S. Cl. .......... 324/508; 324/503; 324/504; 307/9.1

(58) Field of Classification Search .............. 324/117 R, 324/117 H, 503, 504, 508; 307/9.1, 10.1
See application file for complete search history.

(56) References Cited

U.S. PATENT DOCUMENTS

| | | | |
|---|---|---|---|
| 4,003,815 A | 1/1977 | Ikeda et al. | |
| 4,617,472 A * | 10/1986 | Slavik | .......................... 307/9.1 |
| 5,748,008 A | 5/1998 | Landreth | |
| 6,183,625 B1 | 2/2001 | Staerzl | |
| 6,559,660 B1 | 5/2003 | Staerzl | |

* cited by examiner

*Primary Examiner* — Vincent Q Nguyen
(74) *Attorney, Agent, or Firm* — Quarles & Brady LLP

(57) ABSTRACT

A current detector and indicator unit are coupled to a shore power cord for monitoring for corrosion-causing galvanic current on the ground wire of the power cord. A current transducer coupled to the ground wire senses current and provides a signal corresponding to the magnitude of the sensed current to a microcontroller. The microcontroller compares the magnitude of the current signal to one or more predetermined thresholds and outputs signals to an indicator unit to display the level of galvanic activity accordingly.

13 Claims, 4 Drawing Sheets

SHORE POWER CORD GROUND WIRE CURRENT DETECTOR

CROSS-REFERENCE TO RELATED APPLICATION

This application claims the benefit of U.S. Provisional Patent Application No. 61/016,249 filed Dec. 21, 2007, which is hereby incorporated by reference.

STATEMENT CONCERNING FEDERALLY SPONSORED RESEARCH OR DEVELOPMENT

Not applicable.

BACKGROUND OF THE INVENTION

1. Field of the Invention

This invention relates to electrical current detection, and in particular to an indicating device that detects electrical current in the ground leg of a shore power cord connected between a land-based power supply and a docked marine vessel.

2. Description of the Prior Art

Large and even many small marine vessels have on-board electrical systems to power accessories including radios, navigational equipment, lights, pumps, refrigeration devices, battery chargers, and the like. When the vessel is at sea, the on-board electrical system is powered by a power source such as batteries, an on-board generator, an alternator on a drive engine, or a combination thereof. When docked, berthed, or otherwise in close proximity to land-based electrical power sources, vessel operators may augment the on-board electrical systems with power from a land-based source. The most common way of providing a ship-to-shore power connection is through the use of a shore power cord. The shore power cord provides a temporary but secure electrical connection between a land-based alternating current (AC) electrical source and a vessel's on-board electrical system.

In a typical marina, each dock or slip has a permanently mounted electrical receptacle specifically intended to provide power to a vessel. When power is needed on a docked boat, a shore power cord is used to connect the power source to the vessel. A conventional shore power cord includes a length of flexible, multi-conductor cable (e.g., hot, neutral and ground wires) having a watertight molded plug and connector at respective ends. The male plug is inserted into the land-based receptacle while the female connector is received by and locked to a charger or power inlet mounted to the vessel.

The hot wire supplies alternating current at a nominal voltage to power the on-board electrical accessories or recharge the batteries while the vessel is docked. The neutral wire is tied to earth, or shore, ground at a land-based power source (such as a circuit breaker) and provides a return path for the alternating current supplied by the hot wire. The ground wire is a redundant path to ground to help prevent electrified equipment and/or stray currents if any electrical accessories, conductors, or connections malfunction. As such, the grounding wire should not conduct electrical current during normal operation.

In a land-based electrical installation, the neutral wires and grounding wires are all connected to the same terminal strip (or bus bar) in the breaker box. In a marine electrical installation, the neutral wire cannot be connected to the vessel ground as doing so would provide an current path to ground through the surrounding water. Therefore, the grounding wire entering a vessel via a shore power cord is electrically coupled to the vessel's direct current (DC) grounded circuit. This circuit includes the negative (−) post of the vessel's DC electrical system. The negative post of the vessel's DC system is, by convention, tied to the vessel's bonding system. Therefore, in a vessel which is properly wired to utilize a shore power connection, the shore-based grounding circuit is electrically coupled to some or all of the underwater metal components of the vessel including propellers, shafts, rudders, outdrives, through-hull fittings, and the like. Though necessary to provide AC and DC leakage current a safe path to ground, the connection of the shore ground wire to the vessel's DC grounded circuit has the potential to create problems with galvanic and electrolytic corrosion.

Commercially available galvanic corrosion protection systems are used to protect underwater metal hardware against naturally occurring corrosion with blocks of alloy comprised primarily of the element zinc, or "zincs". Zinc is a highly anodic metal, and typically far less noble (i.e., more galvanically active) than the metals, such as stainless steel, naval brass, and bronze, used for underwater fittings. Zincs are referred to as "sacrificial anodes" as zinc is more likely to give up electrons to seawater, and thus corrode faster, than the more noble alloys used in marine fittings.

The potential for greater galvanic corrosion increases when two vessels are hooked up to shore power and in close proximity to each other. If one of the vessels has any metal hardware dissimilar to the metal hardware on the neighboring vessel, a wet-cell battery effect is formed. The less noble metal hardware (e.g., an aluminum outdrive) of one vessel acts as a negative plate while the more noble hardware (e.g., a bronze rudder) of the second vessel acts as a positive plate. The surrounding seawater serves as an electrolyte and an electrical current is generated across the grounding wire of the shore power cord. The magnitude and speed of the corrosion is directly proportional to the difference of nobility between the opposing alloys.

The problem of electrolytic corrosion is similar to galvanic corrosion. In the case of electrolytic corrosion the degradation of the underwater metals is accelerated by a stray DC current emanating from one of the vessels. This may be caused by faulty wiring, a poorly grounded on-board appliance, etc. Electrolytic corrosion is often indiscernible from galvanic corrosion, and in fact the term galvanic corrosion is sometimes used to describe either type of corrosion.

Regardless of the technical classification of the corrosion, it is important to note that in most instances accelerated corrosion of underwater metal components on a vessel is directly related to the transfer of electrons (i.e., current) through the electrical connection, established through the grounding leg of the shore power cord, between adjacent vessels. Therefore, what is needed is a device that senses and alerts a vessel owner to the existence of a DC current on the grounding leg of the shore power cord. By doing so, excessive galvanic and/or electrolytic corrosion could be prevented by identifying a vessel operator of highly corrosive environments or conditions. Once these environments or conditions are recognized, preventative measures such as galvanic isolators, modified bonding systems, and additional sacrificial anodic protection can be put in place.

Ground fault circuit interrupters (GFCI), monitor the AC current between the hot and neutral wires of an electrical circuit. Under normal operation the current flowing into the circuit on the hot wire is equal to the current returning on the neutral wire. Any difference between the two currents exceeding a threshold value (e.g., 5 mA in a standard US GFCI-equipped outlet) is interpreted as a short circuit or other excessive leakage current-causing malfunction and power is removed from the hot leg of the circuit. However, GFCI devices do not monitor DC, i.e., galvanic, current, nor do they monitor the grounding leg of a circuit, where such current occurs. Moreover, GFCI devices are typically not used on shore power receptacles in the U.S. because the standard threshold trip currents (5 mA) are smaller than the currents which often 'leak' from on-board electrical systems, making them prone to tripping prematurely. Though functionally different, ground fault circuit breakers (GFCB) and residual current devices (RCD) do not protect against galvanic corrosion for the same reasons as with a GFCI. Therefore, a need exists for a device to monitor the grounding leg of a shore power cord and provide an indication as to the existence of corrosion-causing currents therein.

Galvanic isolators, are devices installed in series with the grounding wire of the shore power cord to block low voltage DC galvanic current flow while still permitting the passage of alternating current normally associated with the grounding wire. In doing so, a galvanic isolator allows the grounding leg of the shore power system to operate as a redundant path for return (ground) currents while preventing the conduction of DC currents normally associated with galvanic corrosion. However, galvanic isolators are often installed only after an appreciable level of corrosion has already occurred. Therefore, a need exists for a device to monitor and provide an indication as to the existence of electrical current potentially indicative of accelerated corrosion.

SUMMARY OF THE INVENTION

One aspect of the invention provides a current sensing and notification device with means for detecting current in a ground wire of a shore power cord, means for comparing any current detected in the ground wire to a predetermined reference magnitude; and means for indicating when the current detected in the ground wire is above the reference magnitude.

Another aspect of the invention provides a shore power cord ground wire current detector having a current sensor coupled to a ground wire of a shore power cord, the sensor being operable to produce a signal representative of a detected current, a controller operable to receive and compare the current signal to a predetermined reference magnitude, and an indicator operable to provide a notification when the detected current on the ground wire is above the first reference magnitude.

Yet another aspect of the invention provides the combination of a shore power cord and a current detector coupled thereto including a male plug able to be electrically connected to a shore-based power supply disposed at one end of a sheathing, a female connector able to be received by a marine vessel electrical inlet disposed at an opposite end of the sheathing, a plurality of conductors, including a hot, neutral and ground conductor, disposed within the sheathing and extending between the plug and the connector, wherein the hot and neutral conductors provide electrical power from the AC power source to the marine vessel, a current sensor coupled to the ground conductor able to detect current in the ground conductor, a display unit, and a microcontroller. The microcontroller receives and compares a signal from the current sensor against a predetermined reference magnitude and controls the display unit accordingly.

The foregoing and other objects and advantages of the invention will appear in the detailed description which follows. In the description, reference is made to the accompanying drawings which illustrate a preferred embodiment of the invention.

DETAILED DESCRIPTION

Figure 1:
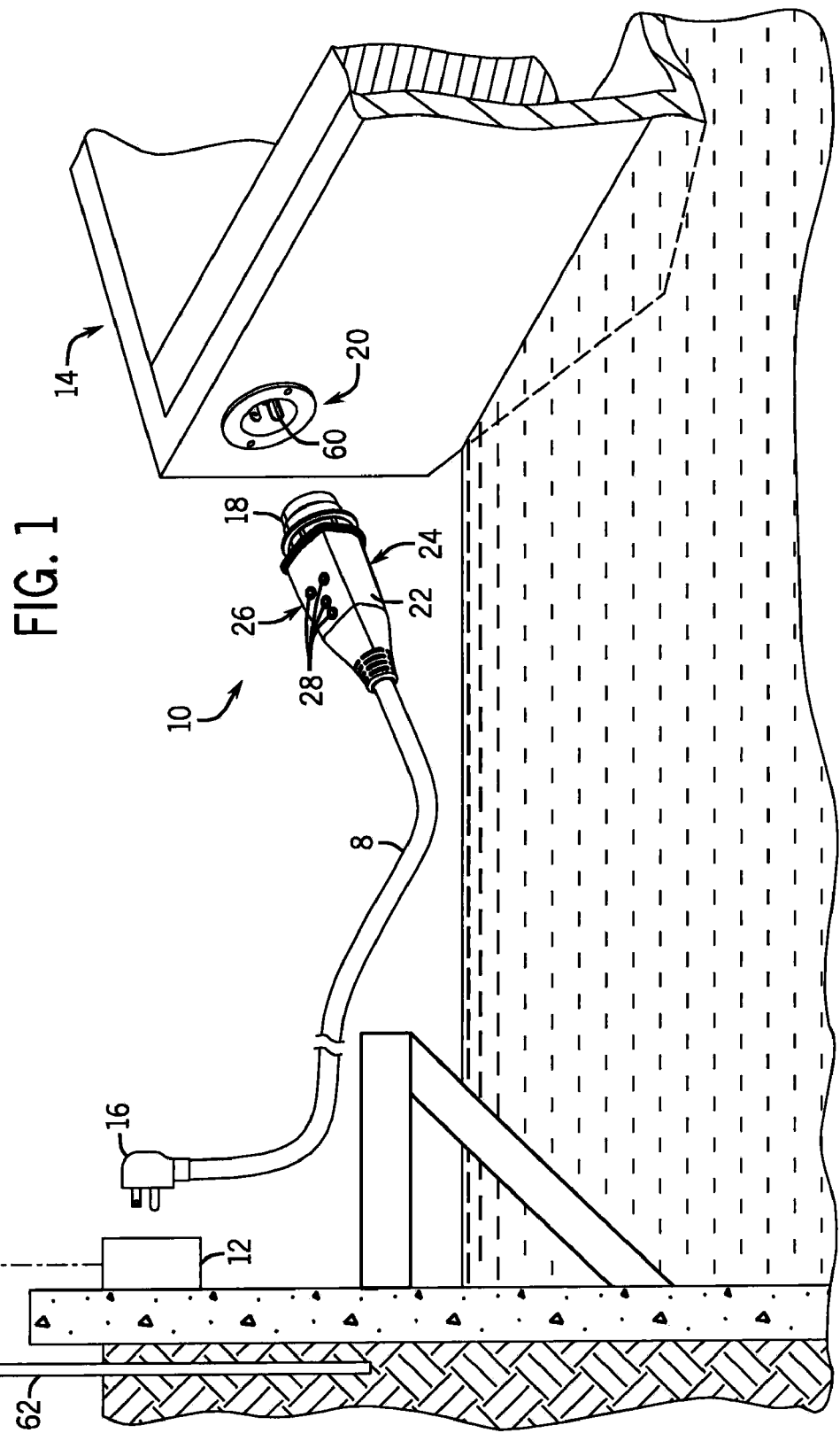
FIG. 1 is a perspective view of one embodiment of a shore power cord ground wire current detector constructed in accordance with the present invention.

Referring to FIG. 1, a shore power cord 8 having a ground wire current detector 10 of the invention is illustrated providing an electrical connection between a shore-based electrical receptacle 12 and a marine vessel 14. One end of the shore power cord 8 includes a conventional molded male plug 16 to receive AC power from a shore-based power supply (not shown) via the receptacle 12. The other end of the cord 8 includes a conventional locking female connector 18 to deliver the AC power to the vessel 14 via a power inlet 20.

The ground wire current detector 10 is integrated into a contoured hand grip 22 of an overmolded watertight housing 24 provided for the female connector 18. The detector 10 and connector 18 are ruggedly constructed while the housing 24 is preferably formed of a corrosion resistant material such as nylon so as to withstand harsh marine environments. The detector 10 includes an indicator 26 comprised of a plurality of LEDs 28 and associated indicia (not shown) embedded into the hand grip 22. Through the combination of the LEDs 28 and the indicia, the indicator 26 is able to convey readily understood information about the galvanic current levels around the marine vessel 14. The LEDs 28 are preferably recessed such that they do not impair the functionality of the shore power cord.

Figure 2:
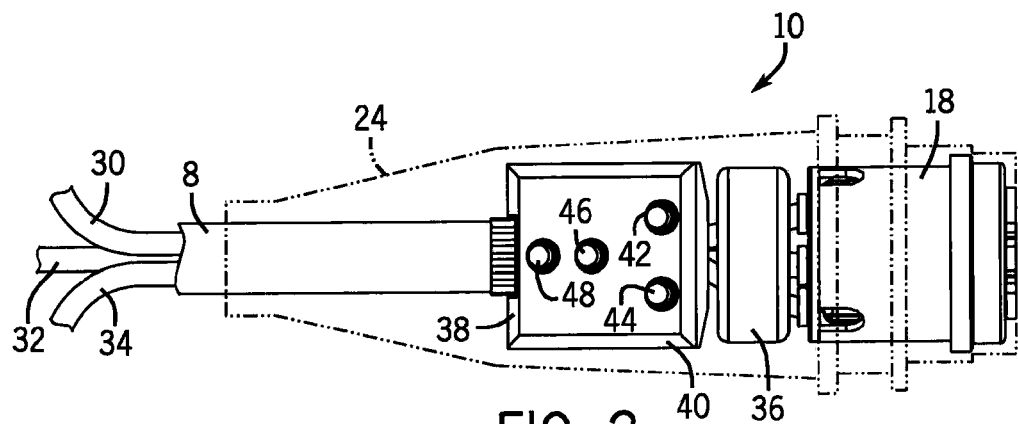
FIG. 2 is a perspective view of the detector of FIG. 1 with a housing shown in phantom.

Referring to FIG. 2, a more detailed illustration of the shore power cord 8 and integrated ground wire current detector 10 is provided. The shore power cord 8 includes a hot wire 30, neutral wire 32, and ground wire 34 connected to and extending between the plug 16 and female connector 18. The ground wire current detector 10 includes a Hall effect based transducer 36 coupled to the ground wire 34 and connected to the electrical circuit 38 of the present invention housed in an enclosure 40.

The indicator 26 includes a green LED 42, a first red LED 44, an amber LED 46, and a second red LED 48. The green LED 42 indicates whether or not shore power is present, at least up to the circuit 38. The first red LED 44 indicates whether or not there is a reverse polarity condition in the shore power supply. The amber LED 46 indicates whether or not there is a medium level of current (i.e., galvanic activity) on the ground wire 34, while the second red LED 48 indicates a high level of current on the ground wire 34.

Figure 3:
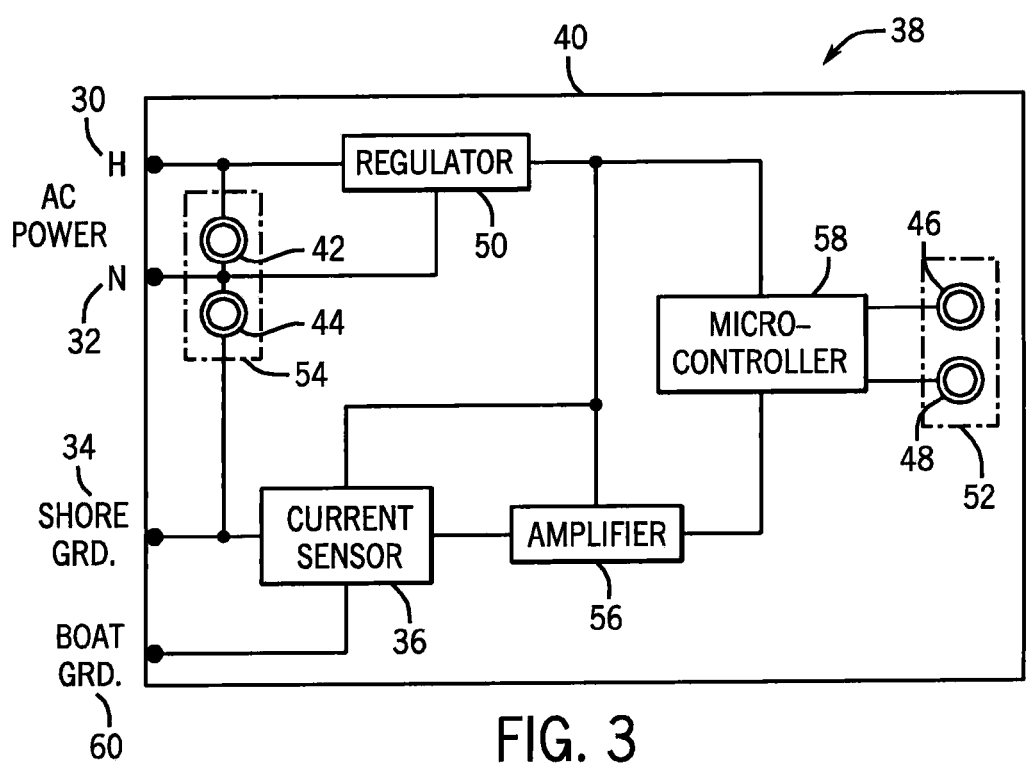
FIG. 3 is a simplified electrical schematic of a circuit used to implement the detector of FIG. 1.

Referring to FIG. 3, a basic schematic representation of the electric circuit 38 of the invention is provided. As shown, the detector 10 includes a power supply/regulator 50, the indicator 26 (shown here split into two groups 52, 54), the current sensor 36, an amplifier 56, and a microcontroller 58. The power supply/regulator 50 receives AC power from the hot and neutral wires 30, 32 of the shore power cord 8 and provides a DC voltage of a preselected magnitude, 5 VDC in a preferred embodiment.

The current sensor 36 is arranged such that low-voltage, low amperage DC current in the shore ground wire 34 or the vessel ground 60 (FIG. 1) can be sensed without regard to any AC or DC current in the hot or neutral wires 30, 32. In the illustrated embodiment, a commercially available Hall effect based current transducer, capable of sensing DC current having a magnitude from 30 mA to 100 mA, is used as the current sensor 36. A Hall effect based transducer is preferred because no electrical contact with the ground wire is needed, thus providing an unrestricted path for fault currents between shore ground 62 and vessel ground 60. The current sensor 36 outputs a signal representative of the current in the ground wire 34 that is amplified by the op amp 56 and provided to the microcontroller 58. The microcontroller 58 compares the signal against one or more predetermined reference magnitudes and outputs a signal to the indicator 26 accordingly.

As shown, the first LED group 52 includes the LEDs 46, 48 that are controlled by the microcontroller 58. If current in the shore power cord ground wire 34 is at or above a first reference magnitude, the microcontroller 58 outputs a signal causing the amber "medium [galvanic] activity" LED 46 to be illuminated. Likewise, if the current is above a second reference magnitude, the microcontroller 58 outputs a signal causing the red "high [galvanic] activity" LED 48 to be illuminated.

The second LED group 54 includes the LEDs 42, 44 that are operated independently of the microcontroller 58. The green "power" LED 42 is illuminated when shore power is present in the circuit 38. The red "reverse polarity" LED 44 is illuminated when the shore power hot and neutral wires 30, 32 are miswired. In a shore power cord 8 receiving power from a properly wired shore-based power supply, the voltage between the neutral and ground wires 32, 34 is zero and the "reverse polarity" LED 52 would not be illuminated. In a situation where reverse polarity exists, a voltage and current sufficient to illuminate the LED 44 is present between the wires 32, 34. In such a case, electrical accessories on the vessel 14 will still generally work, but it if a short circuit occurs in a piece of equipment such as a tool, the tool body may become energized without a path to ground until touched by a user.

Figure 4:
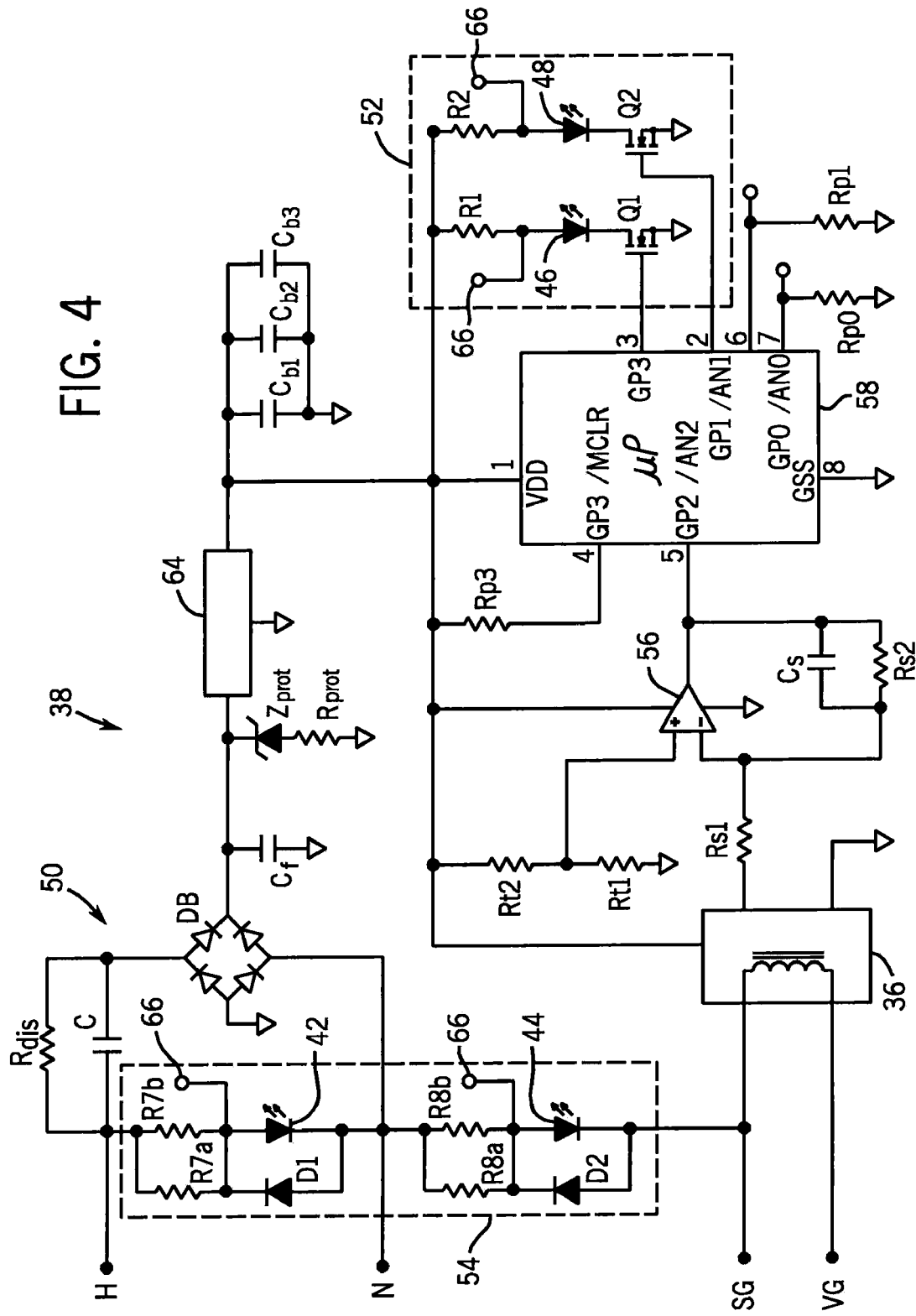
FIG. 4 is a more detailed electrical schematic of the circuit of FIG. 3.

Referring to FIG. 4, a more detailed schematic representation of the electric circuit 38 of the detector 10 is provided. The components identified in FIG. 4 are listed in Table 1 along with their values or type identifications. It should be understood that various other combinations of components can be used to perform the function of the present invention. All of the components shown in FIG. 4 are available in commercial quantities and their individual functions are understood by those of skill in the art. Therefore, the individual operation of each of the components in FIG. 4 is not described in detail herein.

TABLE 1

| Reference | Component Type or Value |
|---|---|
| R1 | 120 Ω |
| R2 | 120 Ω |
| R7a | 22 kΩ |
| R7b | 22 kΩ |
| R8a | 22 kΩ |
| R8b | 22 kΩ |
| Rp0 | 5.1 kΩ |
| Rp1 | 5.1 kΩ |
| Rp3 | 5.1 kΩ |
| Rs1 | 10.5 kΩ |
| Rs2 | 100 kΩ |
| Rt1 | 10.5 kΩ |

TABLE 1-continued

| Reference | Component Type or Value |
|---|---|
| Rt2 | 10.2 kΩ |
| Rdis | 100 kΩ |
| Rprot | 12 Ω |
| C | 3.3 μF |
| Cb1 | .33 μF |
| Cb2 | .33 μF |
| Cb3 | .33 μF |
| Cfilter | 470 μF |
| Cs | 0.33 μF |
| D1 | 200 V |
| D2 | 200 V |
| Zprot | 7.5 V |
| Q1 | >30 mA |
| Q2 | >30 mA |

A nominal voltage of 120 VAC is supplied from the shore-based power supply to the detector 10 via the hot and neutral wires 30, 32 of the shore power cord 8. The power supply circuit 50 provides regulated power to other components of the circuit through commonly available electrical connectors, wires, solder, jumpers, or the like. The power supply circuit 38 comprises a voltage regulator IC 64, two diodes D1, D2, one Zener diode Zprot, filtering capacitor Cfilter, a diode bridge rectifier DB, green "power" LED 51, red, "reverse polarity" LED 52, current limiting resistors R7a, R7b, R8a, R8b, and various biasing components Rdis, C, Cb1, Cb2, and Cb3.

The shore power is delivered to the diode bridge rectifier DB, part number MB2S, which ensures that a proper polarity voltage is supplied to the input of the voltage regulator IC U5. Filter capacitor Cfilter smoothes out the positive waveform from the output of the bridge rectifier DB. A preferred voltage regulator IC U5 is a 5V, 1.5 A Fixed Positive voltage regulator available from Texas Instruments under model number VA7805, and is capable of regulating the nominal input voltage to an output voltage of 5.0 VDC.

The power supply circuit 50 supplies the 5 VDC power to other components in the detector 10. Other similar voltage regulators, bridge rectifiers, and the like, having different nominal input and output voltages may be substituted depending on various design considerations. A terminal block may also be provided.

The current transducer 36 outputs a variable voltage signal proportional to the magnitude of the sensed ground wire current to the op amp 56 through a resistor Rs1. A preferred op-amp 56 is identified as type LM358. The op amp 56 amplifies the output signal from the transducer 36 and provides an amplified signal to the microcontroller 58. Suitable microcontrollers are well known in the art. A preferred controller is the PIC12F675, an 8-pin flash-based 8-bit CMOS microcontroller, available from Microchip Technology, Inc. of Chandler, Ariz.

If the current in the ground wire 34 is above a predetermined value representative of medium galvanic activity, the microcontroller 58 generates an output signal that is received by the gate terminal of a first driver transistor Q1. The signal causes a low impedance path to ground through the first driver transistor Q1, thus providing a current path for illuminating the amber "medium activity" LED 46. Likewise, if the current in the ground wire 34 is above a predetermined value representative of high galvanic corrosion activity, the microcontroller 58 generates an output signal received by the gate terminal of a second driver transistor Q2, causing the red "high activity" LED 48 to be illuminated. In the preferred embodiment, each of the LEDs 28 of the indicator 26 is provided with a "push-to-test" feature 66 to ensure that the LEDs 28 are still operational.

Detection of current in the ground wire 34 could be in both directions. Current in one direction would indicate the vessel 14 connected to the shore power cord 8 is corroding while current in the opposite direction would indicate that a different vessel is corroding, i.e., acting as the anode, and the vessel 14 is acting as the cathode.

Other configurations for the detector 10, including being integrated into a fixed shore receptacle, a vessel electrical inlet receptacle, a shore power cord plug end, or at some point therebetween, are possible. Alternatively, the detector 10 may be designed as a stand-alone device with male and female ends that can be temporarily or permanently connected between a shore-based receptacle and the plug end of the shore power cord, between the connector end of the power cord and a vessel electrical inlet receptacle, or split between two or more locations. The controller circuit may be disposed in one location and the notification circuit located in a different location, such in a remote notification panel. As should be appreciated, specific embodiments of the detector 10 will be uniquely desirable given different design constraints and/or specific application requirements.

Figure 5:
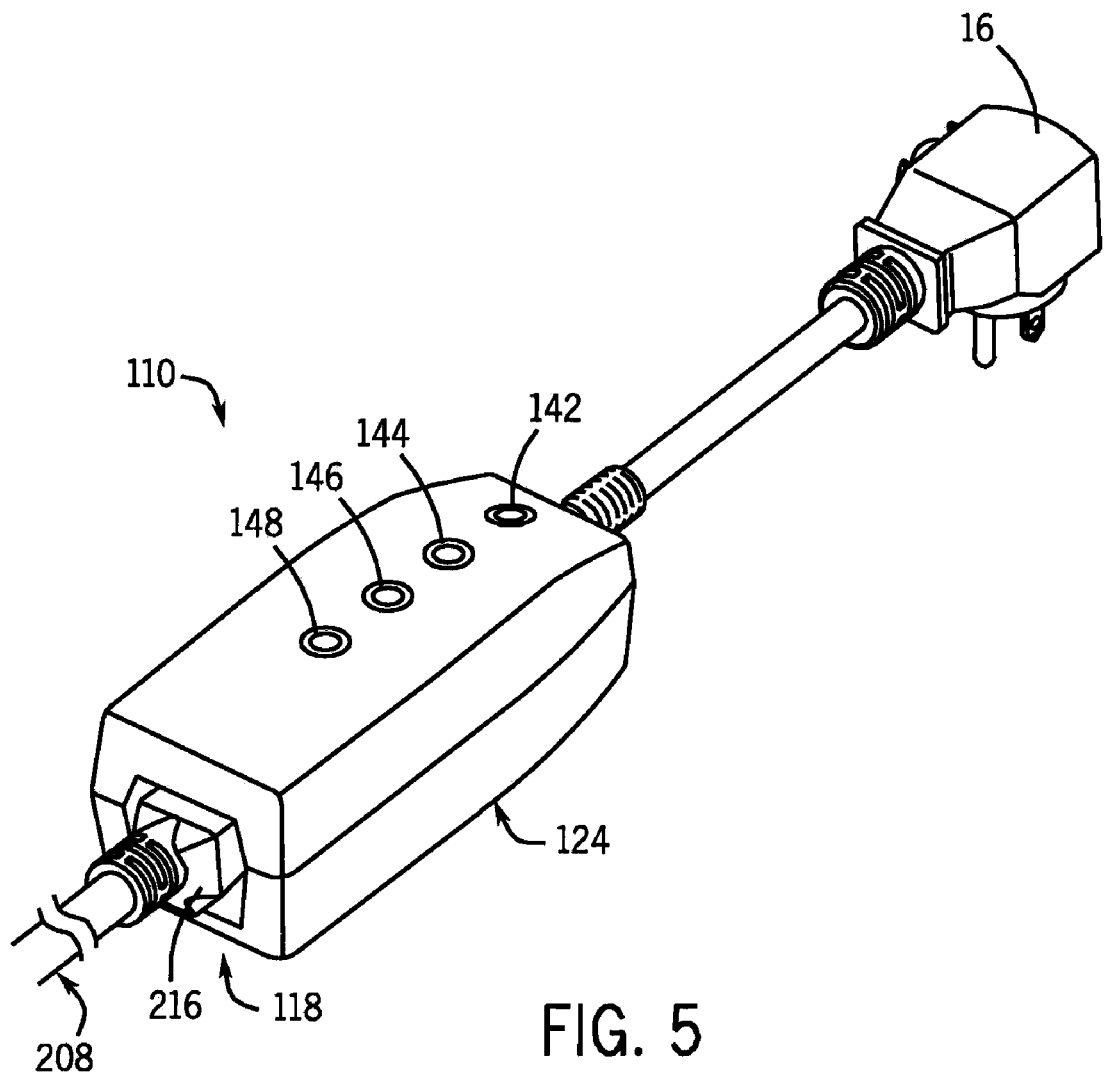
FIG. 5 is a perspective view of a second embodiment of a shore power cord ground wire current detector constructed in accordance with the present invention.

Referring to FIG. 5, a second embodiment of a shore power cord ground wire current detector 110 of the present invention is illustrated. The current detector 110 is incorporated into a watertight housing 124 with a male plug 116 and a female connector 118. The male plug 116 connects to the shore-based receptacle 12 (FIG. 1) and the female connector 118 receives a male plug 216 of a conventional shore power cord 208. The current detector 110 is intended to be used in conjunction with all existing code-compliant conventional shore power cords 208, thus alleviating the need to purchase an integrated unit.

The current sensor, indicator unit 126, and microcontroller are disposed in the housing 124 of the current detector 110. The indicator unit 126 is comprised of a plurality of LEDs, including a green "power" LED 142, a red "reverse polarity" LED 144, an amber "medium galvanic activity" LED 146, and a red "high galvanic activity" LED 148.

In another contemplated embodiment, a varying indicator may be incorporated into the detector 10. A varying indicator provides finer resolution of the magnitude of galvanic current in the ground wire 34 rather than just threshold value indications. This may be communicated in any of several manners including, but not limited to, a series of 'escalating' LED lights (e.g., green, yellow, red), an LCD bar graph, an analog dial meter display, a varying volume signal, beeping frequency or tone of an audible alarm, vibrations, and the like.

Preferred embodiments of the invention have been described in considerable detail. Many modifications and variations to the preferred embodiments described and illustrated will be apparent to a person of ordinary skill in the art. Therefore, the invention should not be limited to the embodiments described, but should be defined by the following claims.

We claim:

1. A current sensing and notification device comprising:
    means for detecting current in a grounding wire of a shore power cord having a hot wire, a neutral wire and the grounding wire, wherein the hot wire and the neutral wire provide a current path for an electrical load and the grounding wire provides a redundant path to ground that is not connected to the electrical load;
    means for comparing current detected in the grounding wire to a predetermined reference magnitude; and
    means for indicating when the current detected in the grounding wire is above the reference magnitude.

2. The device of claim 1, wherein the detecting means is a Hall effect based transducer, the comparing means include a microcontroller, and the indicating means includes at least one visual indicator.

3. The device of claim 2, wherein the visual indicator includes a first LED configured to be illuminated when a hot wire of the shore power cord is energized, and a second LED configured to be illuminated when the current detected in the grounding wire is above the predetermined reference magnitude.

4. A three wire shore power cord grounding wire current detector for detecting a leakage current in the grounding wire of the three wire shore power cord in which one of the three wires is the grounding wire to provide a redundant path to ground and the other two wires are hot and neutral wires and supply electrical current to an electrical load, the current detector comprising,
    a current sensor coupled to the grounding wire of the shore power cord operable to produce a signal representative of a sensed current;
    a controller operable to receive and compare the current signal to a first reference magnitude; and
    an indicator operable to provide a visual notification when the current signal is above the first reference magnitude.

5. The detector of claim 4, wherein the indicator is at least partially illuminated when the current signal produced by the sensor exceeds the first reference magnitude threshold.

6. The detector of claim 5, wherein the indicator includes a plurality of LEDs.

7. The detector of claim 6, wherein the controller is a microcontroller further operable to compare the current signal to a second reference magnitude.

8. The detector of claim 7, wherein the indicator comprises a first LED and a second LED; wherein the first LED is illuminated when the current signal is above the first reference magnitude and the second LED is illuminated when the current signal is above the second reference magnitude.

9. The detector of claim 4, wherein the current sensor is a Hall effect-based current transducer.

10. The combination of a shore power cord and a current detector coupled thereto, the combination comprising:
    a male plug configured to be electrically connected to a shore-based power supply;
    a female connector configured to be received by a marine vessel electrical inlet;
    a plurality of conductors disposed within a sheath extending between the plug and the connector, the plurality of conductors including at least one each of a hot, neutral, and grounding conductor; wherein the hot and neutral conductors are operable to provide electrical power from the AC power source to the marine vessel;
    a current sensor coupled to the grounding conductor operable to detect current in the grounding conductor;
    an indicator unit configured to provide an indication of current in the grounding conductor; and
    a microcontroller operable to receive and compare a signal from the current sensor to a predetermined reference magnitude.

11. The combination of claim 10, wherein the indicator unit includes a plurality of LEDs, wherein a first LED is illuminated if the current detected in the grounding wire is above a first predetermined threshold and a second LED is illuminated if the current detected in the grounding wire is above a second predetermined threshold.

12. The combination of claim 10, wherein the current sensor, indicator unit and microcontroller are disposed in the cord between the plug and the connector.

13. The combination of claim 10, wherein the current sensor, indicator unit and microcontroller are provided in a housing having a male plug and a female connector, and wherein one of the plug and connector are connected to the cord.

\* \* \* \* \*